METHOD FOR PRODUCING PRINTED CIRCUIT

Filed July 22, 1953

INVENTOR.
Nathan Pritikin
BY
Thiess, Olson, Mecklenburger, von Holst, + Coltman. Attys.

United States Patent Office 2,721,822
Patented Oct. 25, 1955

2,721,822

METHOD FOR PRODUCING PRINTED CIRCUIT

Nathan Pritikin, Chicago, Ill.

Application July 22, 1953, Serial No. 369,550
6 Claims. (Cl. 154—95)

This invention relates to printed circuits with cross-over connections and to a method for producing such printed circuits. It is an object of the invention to provide an improved printed circuit and method of such character.

A single printed circuit is basically two dimensional and accordingly does not contain crossing conductors which are insulated from each other. However, in various applications of printed circuits it is necessary to provide conductors which cross over each other and which are insulated from each other. In order to provide such crossing conductors it is necessary to employ, in effect, two or more printed circuits arranged in superimposed relationship with insulation between adjacent circuits. Various devices have been employed in the prior art for connecting together various conductors of two or more printed circuits. Every previously known device of this character, however, has serious drawbacks such as high cost, insecure electrical contact, and inadequate insulation. Various of the previously known devices also have the disadvantage that they protrude substantially beyond the surfaces of the printed circuits which are electrically connected thereby. In such case a plurality of printed circuits cannot be stacked without an appreciable space being left between the various adjacent laminations. Still further, presently known methods and devices are not well adapted to use with embedded circuits, and the uppermost, or exposed, circuit is ridged where other printed circuits lie thereunder.

According to the present invention, connection is made between two or more printed circuits through holes in the layers of insulating material which separate the adjacent printed circuits. Such an arrangement has been employed in the prior art but it has been necessary to resort to undesirable methods of applying one or both of the printed circuits in order to obtain contact between printed circuits through the holes or openings through the intermediate insulating material. The insulating material normally consists of a plastic sheet which constitutes the base or body of the ultimate printed circuit assembly. As such it is necessary that this plastic sheet have subtantial thickness, for example, on the order of 1/16" to 1/4". Even in the case of the thinnest sheets employed for this purpose, contact between printed circuits on opposite sides of the sheet cannot be made through holes in the sheet of reasonable diameter by any one of the preferred methods of applying printed circuits, these methods including printing, rolling, screening and etched foil processes. On the contrary, it has been necessary to resort to spraying or other undesirable expedients, such as the use of metal inserts, in order to obtain a conducting path through the openings in such a sheet of insulating material.

In accordance with the present invention the insulating material between printed circuits does not constitute the base of the ultimate circuit assembly, and accordingly may be made extremely thin whereby a printed circuit which is printed, rolled or screened onto the thin layer of insulating material may readily extend through even very small openings in the insulating material to engage selected portions of a printed circuit on the other side of the insulating material. Furthermore, according to the preferred embodiment of the invention, the entire printed circuit assembly is embedded in the base of the printed circuit assembly, this arrangement being desirable for reasons well known in the art.

Accordingly it is another object of the invention to provide an improved method for producing printed circuits wherein connection between superimposed printed circuits is obtained during the formation of one of the printed circuits by methods preferred in the art including rolling, printing and screening.

It is another object of the invention to provide an improved embedded printed circuit having cross-over connections. It is another object of the invention to provide an improved method for producing such a printed circuit.

It is another object of the invention to provide an improved printed circuit assembly having two or more superimposed printed circuits in which connections between the various printed circuits is accomplished by means which extend only between and not beyond the printed circuits to be joined. It is another object of the invention to provide an improved method for producing such a printed circuit.

This invention, together with further objects and advantages thereof, will best be understood by reference to the following description taken in connection with the accompanying drawing, and its scope will be pointed out in the appended claims.

In the drawing in which like parts are designated by like reference numerals,

Figure 1:
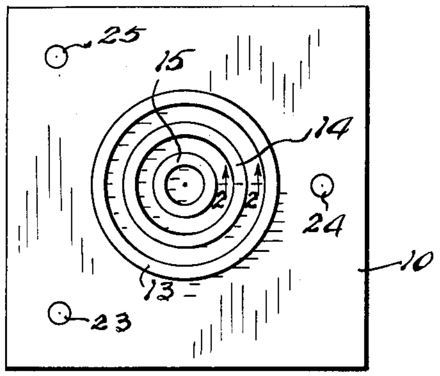
Figure 1 is a plan view of a printed circuit mounted on a temporary support or base and illustrating the initial step in a method constituting one embodiment of the invention.
Figure 2:
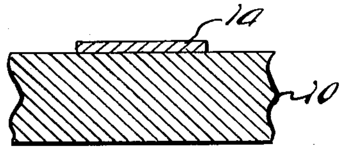
Fig. 2 is an enlarged cross-sectional view taken along the line 2—2 of Fig. 1.

The embodiment of the invention illustrated in the drawing relates to a commutator. In Fig. 1 there may be seen a temporary base 10 to the surface of which are secured three commutator rings 13, 14 and 15 and three terminals 23, 24 and 25.

In this particular device a series of three moving brushes, not shown in the drawings, are intended to ride along the commutator rings 13, 14 and 15, and three stationary conductors, not shown in the drawings, are intended to be connected to the terminals 23, 24 and 25. The rings and terminals of the particular embodiment illustrated constitute what is termed herein the first printed circuit. It is desired that the three rings be connected to the three corresponding terminals in order that electrical contact may be made between the three stationary conductors and the three brushes through the terminals and the rings. It will be apparent that connection between the terminals and the rings cannot be made in the plane of the terminals and the rings, but must be made in a different plane whereby they may be insulated from the rings to which they are not intended to connect. Such connections constitute a second printed circuit, and it is to the problem of interconnecting two such printed circuits that the invention is directed.

In the preferred embodiment of the invention, now to be described, the first printed circuit is completely formed before the remainder of the printed circuit assembly is built up. According to this embodiment of the invention, the temporary base 10 is preferably an electrolytic plate upon which metal is electrolytically deposited to form the printed circuit comprising the commutator rings and the terminals. Such an electrolytic plating process is disclosed and claimed in application Serial No. 322,741, entitled "Electrolytic Method and Apparatus for Forming Printed Circuits," filed November 26, 1952, by the same inventor. However, the base 10 may be a simple platen, of any suitable material, which serves as a temporary base in the formation of the same printed circuit by an etched foil process. As a further alternative the printed circuit may be of a plastic conducting material, such as Du Pont No. 4929 conducting paste, which is painted or screened onto the base 10, although this is not desirable where the circuit is that shown in Fig. 1 since it is subject to wear.

After the first printed circuit illustrated in Fig. 1 has been produced, the surface of the printed circuit is coated, preferably by a screening process, with any suitable plastic insulating material 16, preferably to a thickness of approximately five mils. Normally it is simplest to cover substantially the entire surface of the base 10 with the insulating material 16 although this is not essential to the process and in some instances it might be preferred to coat only the printed circuit and closely adjacent portions of the base 10, or even to coat only those portions of the printed circuit which are to be insulated from crossing portions of another circuit or other circuits.

Figure 4:
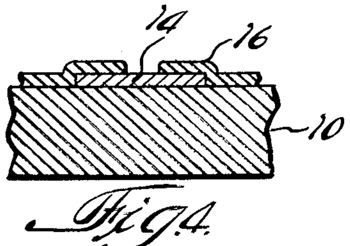
Fig. 4 is an enlarged cross-sectional view taken along the line 4—4 of Fig. 3.
Figure 3:
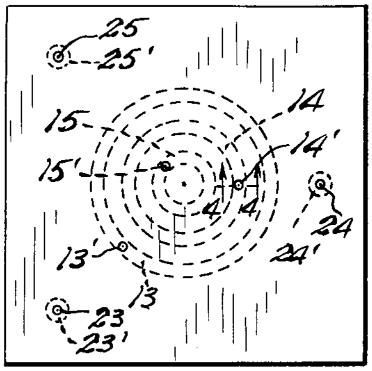
Fig. 3 is a view similar to Fig. 1 illustrating the same printed circuit after an additional operation has been performed.

In the preferred embodiment of the invention six small openings 13′, 14′, 15′, and 23′, 24′ and 25′ are provided in the otherwise continuous insulating film, the first three openings lying directly over respective ones of the commutator rings 13, 14 and 15, as seen in Figs. 3 and 4, and the other three openings 23′, 24′ and 25′ lying over the terminals 23, 24 and 25, respectively.

Figure 6:
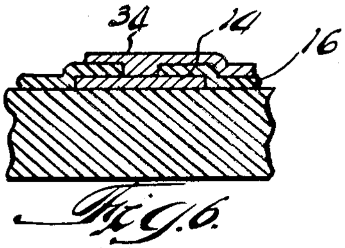
Fig. 6 is a cross-sectional view taken along the line 6—6 of Fig. 5.
Figure 7:
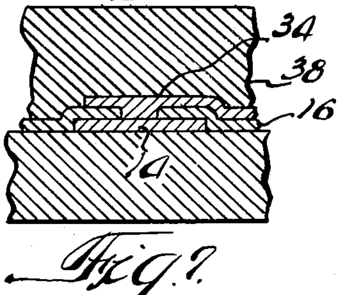
Fig. 7 is a cross-sectional view similar to Fig. 6 illustrating the same printed circuit after the completion of still another operation; and, Fig. 8 is a cross-sectional view similar to Fig. 7 illustrating the printed circuit of Figs. 1–7 in completed form.
Figure 5:
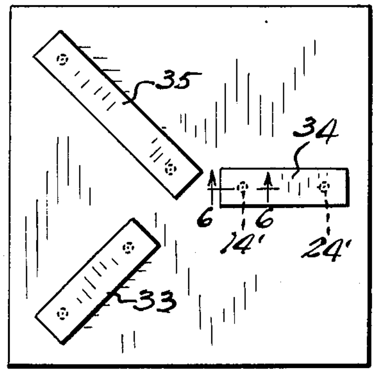
Fig. 5 is a view similar to Figs. 1 and 3 illustrating the same printed circuit after another operation has been completed.

Cross-over connections 33, 34 and 35 are now painted or screened onto the exposed surface of the insulating material 12 as illustrated in Figs. 5 and 6. The material employed for these cross-over connections may be any suitable plastic conducting compound such as the Du Pont product suggested above. Since the material of which the cross-over connections 33, 34 and 35 are composed is plastic, and preferably quite soft, and since the thickness of the insulating film 16 (approximately five mils) is small relative to the diameter of the openings left therein, the material of the cross-over connections readily flows into the openings and contacts the portions of the commutator rings or terminals lying therebelow, as illustrated in Fig. 6. It may readily be seen that by this process the commutator ring 14 is electrically connected to the terminal 24 and that the other two commutator rings are connected to the corresponding other two terminals.

Where the cross-over connections 33, 34 and 35 are to be screened on it is preferable that the insulating film 16 be not more than five to ten mils thick since a normal screening process does not permit a penetration of more than a few mils by the screened-on material. A thickness of five mils for the insulating material 16 will safely permit voltages on the order of five hundred to one thousand volts between crossing components of the two printed circuits, for example where the cross-over connection 34 crosses over the commutator ring 13. Where greater voltages are required a thicker layer of insulating material 16 may be applied. In this case the cross-over connections 33, 34 and 35 may readily be applied by screening a heavy layer of thin conducting paste, or by printing or rolling with a relatively soft platen or roller.

A permanent base or support, preferably a sheet 38 of uncured thermosetting plastic material, is then laid over the upper surface of the printed circuit assembly thus far produced and the entire assembly is subjected to a suitable temperature and pressure to mold the base to the printed circuit and to cause thermosetting of any thermosetting plastic materials employed. The pressure and temperature also bond the plastic materials firmly to the associated parts contacted thereby. The assembly may subsequently be removed from the temporary base 10 by a thermal or mechanical shock, or may merely be torn off where the printed circuit assembly is reasonably pliable. Alternatively, the temporary base may be dissolved chemically where appropriate materials are employed. In such case, the temporary base is preferably a thin film, backed up by an independent, rigid base. A thin copper sheet or foil may serve as a temporary base, a silver first circuit being electrolytically deposited thereon in the desired configuration. After the printed circuit assembly has been completed the copper may be etched away by an aqueous solution of ferric chloride having a specific gravity of 40° Baumé. This process is disclosed and claimed in Patent No. 2,692,190, entitled Method of Making Inlaid Circuits, issued October 19, 1954, and filed August 17, 1953, by the same inventor, and accordingly it is not described in detail herein.

Figure 8:
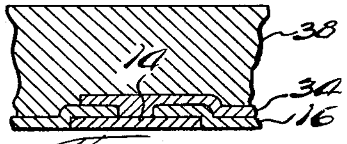

It will readily be seen in Fig. 8 that according to the embodiment of the invention so far described the printed circuit in its final form has a flush surface, that is, the circuit is embedded in the base 38. This result is obtained even though the circuit actually comprises two superimposed printed circuits, separated at least in the desired areas by a layer of insulating material.

In accordance with another embodiment of the invention the first circuit is formed after the printed circuit as a whole has otherwise been completed. More specifically, a metal foil may be laid on a temporary base, following which all of the steps described above are employed up to and including lifting the entire printed circuit from the temporary base.

At this point the printed circuit constructed in accordance with this embodiment of the invention is identical to that described above, with the exception that the first printed circuit is a continuous sheet of metal foil. This metal foil may then be etched by any of the various processes commonly employed in producing etched foil circuits. For example, the metal foil may be silver and the insulating material may be an epoxy resin, such as Shell Company's Epon resin. The silver foil may then be etched in the desired pattern by nitric acid. Alternatively, the desired portion of the metal foil may be protected by suitable resist and the remaining portions of the foil removed by electrolytic action.

It will be understood that when the circuit is produced in this manner the lower surface of the insulating film 16, as viewed in Fig. 6, will be flat, since it was applied to a continuous flat sheet of metal foil and was allowed to harden or was thermally set in that condition. Accordingly, the principal or first printed circuit is not embedded but protrudes, in its entirety, outwardly of the insulating film 16.

Accordingly, while the results obtained in the various embodiments of the invention described differ in that the first described embodiments produce embedded circuits while the last described embodiment produces a first circuit which is not embedded, it will readily be seen that the processes involved are very similar and in fact differ in only one respect. In all cases all of the various steps involved are performed with the first printed circuit adhering to a temporary base, following which the printed circuit assembly is completed and removed from the temporary base. The only distinction lies in the fact that in the last described embodiment, the first printed circuit is a continuous sheet of metal foil. In order to complete this first printed circuit, it is necessary to treat the foil in any desired manner, after formation of the printed circuit assembly, to produce the desired pattern.

It has been indicated above that the insulating film 16, the cross-over connections 33, 34, and 35 and the permanent base 38 are of plastic material. The term "plastic" as employed herein is used in the general sense to indicate the characteristic of workability rather than as an indication of a type of chemical composition. Furthermore, it is intended to be interpreted broadly so as to include materials which might be more specifically termed liquids. Preferably, all of these plastic materials are thermosetting plastics for reasons well known in the art. Where thermosetting plastics are used, and where fine circuits or small openings in an otherwise continuous insulating film 16 are required, it is desirable that the assembly of Figs. 5 and 6 be subjected to a temperature which will cause partial setting of these thermosetting plastics prior to the application of the permanent base 38. This precaution will prevent shifting of the film 16 and of the plastic printed circuit during the application of pressure and temperature in the final thermal setting of base 38 and the other thermosetting plastic materials.

If the desired circuitry is sufficiently complex and three or more individual circuits are required, a second layer of insulating material may be applied to the assembly of Figs. 5 and 6 with suitable openings therein to provide the necessary connections between the cross-over connections 33, 34 and 35 and the third printed circuit which is subsequently applied to the exposed surface of the second insulating layer. This process may be repeated as often as necessary to produce the desired number of connected printed circuits. Where connection is desired between the first and third or fourth printed circuit, openings may be provided in the two or more intervening layers of insulating material in such location as to permit such electrical connection. In such case it may be preferable to apply a spot of conducting material between such intervening layers of insulating material simultaneously with the application of the intervening printed circuits.

It will now be seen that the disclosed embodiments of the invention permit the building up of a number of superimposed printed circuits which are firmly electrically connected at the desired points, the circuits being obtained by the preferred and most commonly employed methods which include printing, rolling and screening. In this connection it should be noted that the thickness of materials in Figs. 2, 4, 6, 7 and 8 of the drawing is greatly exaggerated in the interest of clarity.

While particular embodiments of the invention have been shown, it will be understood, of course, that the invention is not limited thereto since many modifications may be made, and it is, therefore, contemplated to cover by the appended claims any such modifications as fall within the true spirit and scope of the invention.

The invention having thus been described, what is claimed and desired to be secured by Letters Patent is:

1. The method of providing an embedded multiple layered printed circuit assembly having electrical connections between layers which comprises, applying a printed circuit to a temporary base, applying a film of insulating material to said circuit to cover at least those portions of said circuit which are to be insulated from conducting portions of a second circuit and to leave exposed at least those portions of said circuit which are to electrically contact such a second circuit, applying a second printed circuit, applying a plastic insulating material to form a permanent base for said circuits, and removing said circuits and said permanent base from said temporary base.

2. The method of providing an embedded multiple layered printed circuit assembly having electrical connections between layers which comprises, applying a printed circuit to a temporary base, applying a film of thermosetting plastic to said circuit to cover at least those portions of said circuit which are to be insulated from conducting portions of a second circuit and to leave exposed at least those portions of said circuit which are to electrically contact such a second circuit, applying a second printed circuit of conducting thermosetting plastic, applying a thermosetting plastic to form a permanent base for said circuits, applying heat and pressure to thermally set said thermoplastic materials, and removing said circuits and said permanent base from said temporary base.

3. The method of providing an embedded multiple layered printed circuit assembly having electrical connections between layers which comprises, applying a printed circuit to a temporary base, applying a film of insulating material to said circuit and to the exposed portions of said temporary base, said film being continuous except for openings therein exposing portions of said circuit which are to electrically contact a second circuit, applying a second printed circuit of plastic conducting material readily flowable into the openings in said insulating film to contact the first-mentioned printed circuit, applying a plastic insulating material to form a permanent base for said circuits, and removing said circuits and said permanent base from said temporary base.

4. The method of providing an embedded multiple layered printed circuit assembly having electrical connections between layers which comprises, applying a printed circuit to a temporary base, applying a film of thermosetting plastic to said circuit and to the exposed portions of said temporary base, said film being continuous except for openings therein exposing portions of said circuit which are to electrically contact a second circuit, applying a second printed circuit of conducting thermosetting plastic of such consistency as to flow readily into the openings in said insulating film to contact the first-mentioned printed circuit, applying a thermosetting plastic to form a permanent base for said circuits, applying heat and pressure to thermally set said thermosetting plastic materials, and removing said circuits and said permanent base from said temporary base.

5. The method of providing a multiple layered printed circuit assembly having electrical connections between layers which comprises, applying material for a printed circuit to a temporary base, applying a film of insulating material to said material to cover at least those portions of said material which are to be insulated from conducting portions of a second circuit and to leave exposed at least those portions of said material which are to electrically contact such a second circuit, applying a second printed circuit, applying a plastic insulating material to form a permanent base for said circuits, and removing said temporary base from the printed circuit assembly so formed.

6. The method of providing a multiple layered printed circuit assembly having electrical connections between layers which comprises, applying material for a printed circuit comprising a sheet of metal foil to a temporary base, applying a film of insulating material to said sheet of metal foil, said film being continuous except for openings therein exposing portions of said sheet of metal foil which are to electrically contact a second circuit, applying a second printed circuit of plastic conducting material readily flowable into the openings in said insulating film to contact said sheet of metal foil, applying a plastic insulating material to form a permanent base, removing said permanent base, said sheet of metal foil, and the intervening elements from said temporary base, and treating said sheet of metal foil to form a circuit of the desired configuration.

References Cited in the file of this patent

UNITED STATES PATENTS

| | | |
|---|---|---|
| 1,804,021 | Miller | May 5, 1931 |
| 2,441,960 | Eisler | May 25, 1948 |
| 2,447,541 | Sabee et al. | Aug. 24, 1948 |